United States Patent [19]
Morris et al.

[11] Patent Number: 5,459,500
[45] Date of Patent: Oct. 17, 1995

[54] CHARGE PLATE CONNECTORS AND METHOD OF MAKING

[75] Inventors: Brian G. Morris, Dayton; Bruce A. Bowling, Beavercreek, both of Ohio

[73] Assignee: Scitex Digital Printing, Inc., Dayton, Ohio

[21] Appl. No.: 857,194

[22] Filed: Mar. 25, 1992

[51] Int. Cl.$^6$ .................................................. B41J 3/04
[52] U.S. Cl. ............................ 347/50; 347/76; 439/91
[58] Field of Search ............................ 347/50, 76, 74, 347/49, 87; 439/66, 91, 591

[56] References Cited

U.S. PATENT DOCUMENTS

| | | | |
|---|---|---|---|
| 4,170,677 | 10/1979 | Hutcheson | 428/119 |
| 4,222,058 | 9/1980 | Gudorf | 347/76 |
| 4,223,321 | 9/1980 | Kenworthy | 347/76 |
| 4,347,522 | 8/1982 | Bahl et al. | 347/76 |
| 4,560,991 | 12/1985 | Schutrum | 347/76 |
| 4,695,854 | 9/1987 | Cruz-Uribe | 347/40 |
| 4,696,764 | 9/1987 | Yamazaki | 252/503 |
| 4,999,647 | 3/1991 | Wood et al. | 347/75 |
| 5,162,613 | 11/1992 | Schoenthaler | 439/66 X |

FOREIGN PATENT DOCUMENTS 1-2783360   11/1989   Japan.

OTHER PUBLICATIONS

The article "Interconnecting Flex Circuitry To Rigid Circuitry Using Anisotropic Conductive Thermoset Film" by Roger R. Reinke.
The article "Interconnection Method of Liquid Crystal Driver LSIs By Tab–On–Glass and Board to Glass Using Anisotropic Conductive Film and Monosotropic Heat Seal Connectors" by Roger R. Reinke.
Technical Data Sheet on Matrix MOE Elastomeric Connectors from Elastomeric Technologies, Inc.
Technical Data Sheet on Silver Stax Elastomeric Connectors from PCK Elastomerics Inc.

*Primary Examiner*—A. T. Grimley
*Assistant Examiner*—Nestor R. Ramirez
*Attorney, Agent, or Firm*—Barbara Joan Haushalter

[57] ABSTRACT

Connections to a charge plate in an ink jet print head are made using anisotropic conductive material. Reliable, high yield connections approaching 200 connections per inch are achieved.

9 Claims, 3 Drawing Sheets

CHARGE PLATE CONNECTORS AND METHOD OF MAKING

FIELD OF THE INVENTION

The present invention relates to ink jet printers and more particularly to improved structures and methods of providing electrical connections to charge plates in such printers.

BACKGROUND

In continuous ink jet printing, electrically conductive ink is supplied under pressure to a manifold that distributes the ink to a plurality of orifices, typically arranged in a linear array(s). The ink discharges from the orifices in filaments which break into droplet streams. The filaments or individual droplets in the streams can be selectively charged by a charge plate and deflected from their normal trajectory. The deflected drops (streams) may be caught in a catcher and recirculated, and the undeflected drops (streams) allowed to proceed to a print receiving medium.

Charging is accomplished by a charge plate having a plurality of charging electrodes along one edge, and a corresponding plurality of leads along one surface of the charge plate. The edge of the charge plate having the charging electrodes is placed in close proximity to the ink jet filaments and charge is applied to the leads to induce charge on the filaments.

U.S. Pat. No. 4,560,991 issued Dec. 24, 1985 to W. Schutrum describes one method of fabricating a charge plate useful in an ink jet printer. In the method disclosed by Schutrum, the charge plate is fabricated by electro-depositing the charging electrodes and leads on a flat sheet of etchable material such as copper foil to form a so-called "coupon". The coupon is bent in a jig at approximately a 90° angle, with the leads and electrodes on the inside of the bend. The leads and electrodes are then bonded to a charge plate substrate, and the etchable material removed. Electrical contact can be made to the leads in a number of ways including pressure contact in a socket, where the charge plate functions as a plug received by the socket, reflow soldering, and wire bonding. As connection densities exceed approximately 25 per inch, the plug and socket technique is no longer feasible. High density reflow solder connections are possible up to about 100 per inch. However, at densities higher than about 50 connections per inch solder crystals can grow after fabrication from one connection to a neighboring connection eventually causing shorts that may not become evident until weeks or months after manufacture. At densities between 50 and 100 connections per inch, there is some loss in yield using the solder technique. At densities greater than 100 connections per inch, there is a substantial loss in yield and reliability using the solder connection technique. Recently, ink jet print heads having 200 to 500 jets per inch requiring charge plates with 200 to 500 charging electrodes per inch are under development. While the electrode leads can be fanned out to achieve the low connection densities achievable by reflow solder connections, such a fan out can add significantly to the size of the lead pattern. The increased area occupied by the lead pattern can produce an undesirably large print head size and also increase the risk of defects, due to pinholes, etc., in the formation of the conductive leads. The reflow soldering technique used to make connections between these high density ink jet print heads and the connectors to the print heads requires a complicated series of manufacturing steps including selectively adding solder to the conductive elements of both the connector and the print head; removing excessive solder from the conductive elements, typically by scraping; applying a controlled amount of solder flux to the electrodes; carefully aligning the electrodes; and heating the solder to cause reflow under carefully controlled temperature and pressure conditions. Frequently, a repair to a faulty connection is required. This process creates several problems since the steps of applying and removing excess solder are very sensitive to operator error. Too much solder creates shorts between adjacent electrodes and too little solder and/or flux results in open circuits between the print head and the connector. These problems are in addition to the problem of growth of lead oxide crystals which over time interact to form shorts between the electrodes.

It is important to note that in the wider ink jet printing heads as illustrated by the 4 inch print head shown in U.S. Pat. No. 4,999,647, the number of connections to the print head are so high that a failure rate that would have produced a yield of approximately 85% in a 1 inch print head would produce a very small percentage yield in the 4 inch print head.

SUMMARY OF THE INVENTION

It is therefore the object of the present invention to provide an electrical connection to a charge plate in an ink jet print head that is capable of exceeding 100 bonds per inch with improved reliability and manufacturability. Electrical connection is made to a charge plate in an ink jet print head according to the present invention by the use of anisotropic connective material.

MODES OF CARRYING OUT THE INVENTION

Figure 1:
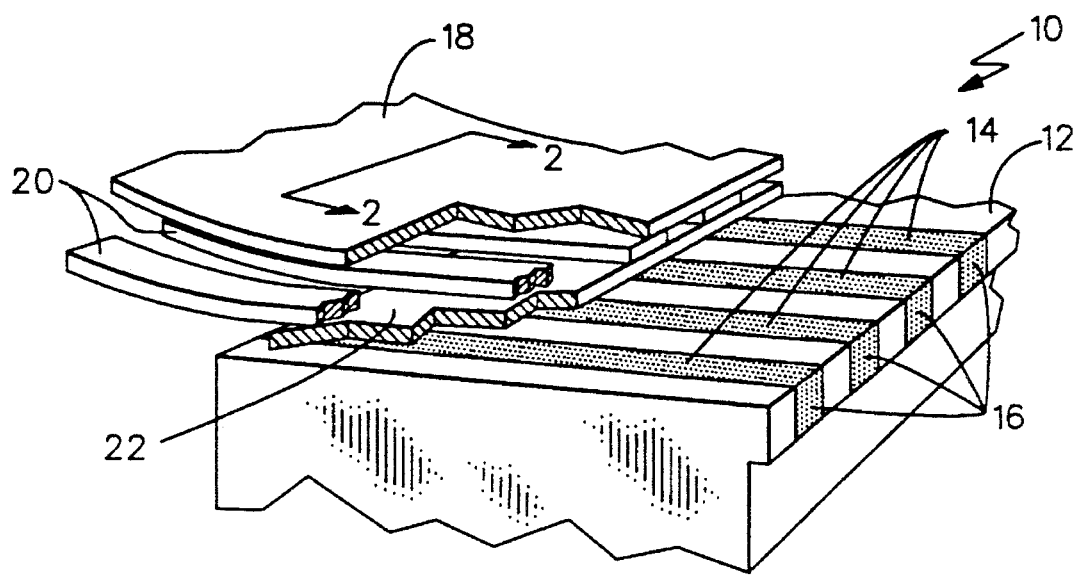
FIG. 1 is a partially broken away perspective view of a charge plate connection according to the present invention.
Figure 2:
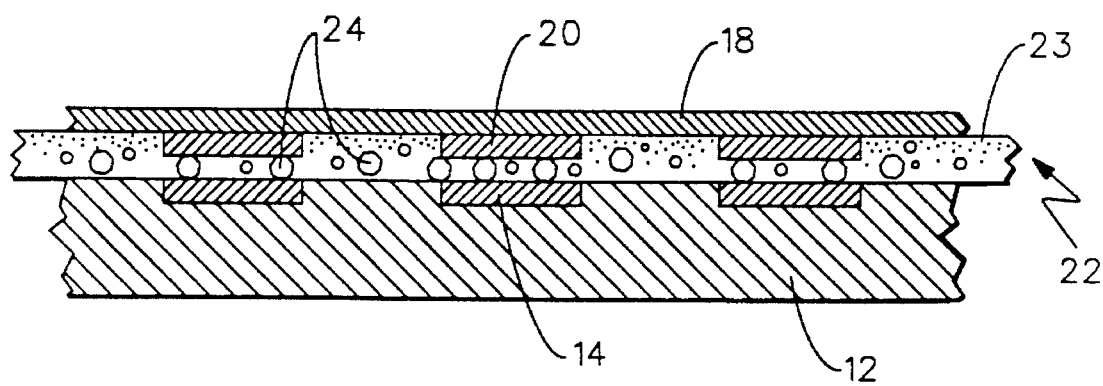
FIG. 2 is a cross-sectional view of the charge plate connection taken along line 2—2 in FIG. 1.
Figure 3:
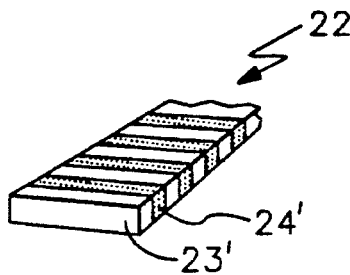
FIG. 3 is a partial perspective view of the anisotropic electrical material employed in the embodiment shown in FIG. 4.
Figure 4:
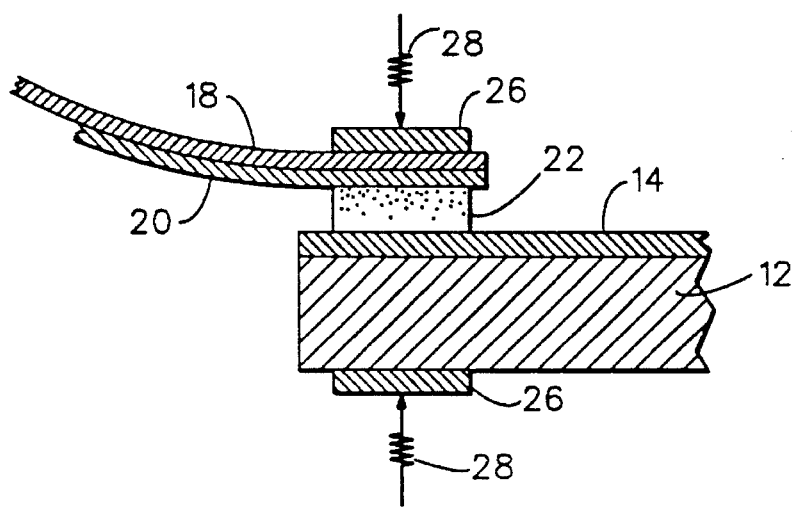
FIG. 4 is a schematic end view of an alternative charge plate connection according to the present invention.

Referring now to FIG. 1, a charge plate connection according to the present invention is partially shown. It will be understood that such a charge plate generally designated 10 cooperates with other known components used in continuous ink jet printers. The charge plate 10, which may also include an integral catcher as described in copending U.S. patent application Ser. No. 07/855,192 to Dan Carity filed on even date herewith, includes an insulating substrate 12 on which are bonded conductive leads 14 and charging electrodes 16. The leads 14 and charging electrodes 16 may be flush with the surface of the charge plate 10 and the leads 14 may be covered with a dielectric layer of protective material (not shown) as described in U.S. patent application Ser. No. 07/857,852 entitled "Charge Plate Structure and Method of Making" filed on even date herewith by Morris et al. An electrical conductor includes a support layer 18 of an insulating material such as polyester or polyimide upon which are supported a plurality of electrically conductive strips 20. The conductive strips 20 are aligned with the conductive leads 14 of the charge plate. A strip of anisotropically conductive material 22 is disposed between the conductive strips 20 and conductive leads 14. The anisotropically conductive material comprises, for example, an insulating material carrying a plurality of electrically conductive elements capable of conducting electricity in a direction perpendicular to the surface of the material but not in a direction parallel to the surface of the material. When the anisotropically conductive material is compressed, for example, by squeezing the electrical conductor and the charge plate together, the electrical conductors in the material are brought into electrical contact with the mating electrical conductors 14 and electrically conductive strips 20. This effect is illustrated in FIG. 2 where the anisotropically conductive material 22 comprises a thermal setting adhesive 23 loaded with conductive particles 24. In the areas between the conductive leads 14 and electrical conductors 20 the conductive particles 24 make electrical contact therebetween. The conductive particles 24 are sufficiently dispersed within the non-conductive adhesive 23 that no shorts are produced between adjacent leads 14. In the example shown in FIG. 2, where the anisotropically conductive material is an uncured adhesive, the adhesive is cured by elevating the temperature at the same time the pressure is applied to establish electrical contact, there by resulting in a strong mechanical bond simultaneously with the making of the electrical contact between the conductors. In an alternative embodiment, as shown in FIG. 3 the anisotropically conductive material 22 may comprise alternating layers of an elastomer 23' and a conductive material 24' such as a silver impregnated elastomer. FIG. 4 shows an application of this elastomeric anisotropically conductive material 22 to form a connection to a charge plate in an ink jet printer. In this embodiment, pressure must be continuously applied to the elastomeric anisotropically conductive material 22 to maintain the electrical contact. A pair of pressure anvils 26 are urged together by springs 28 to squeeze the elastomeric anisotropically conductive material 22 between the charge plate 12 and the electrical conductors 20.

Figure 7:
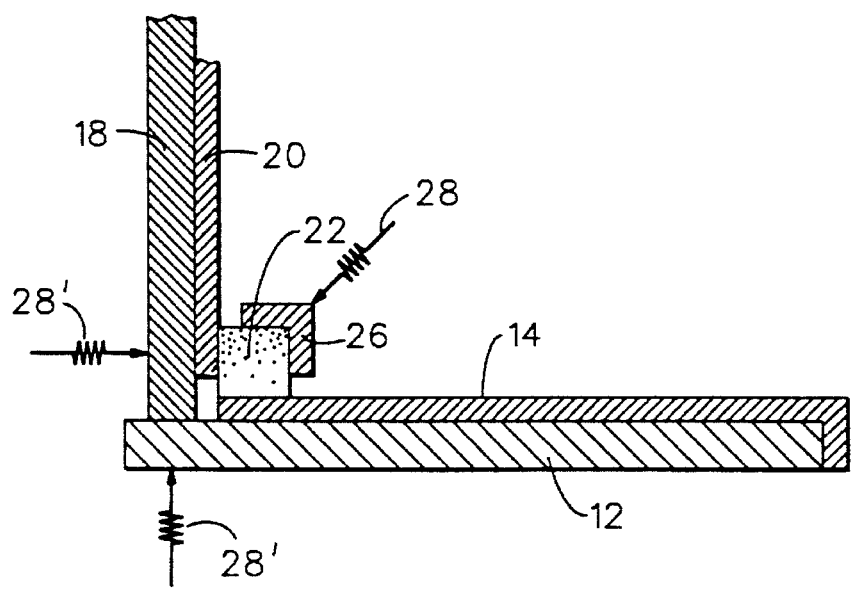
FIG. 7 is a schematic showing a further alternative charge plate connection according to the present invention.

According to an alternative embodiment shown in FIG. 7, the electrical conductor is arranged at an angle with the charge plate 12 to form a corner. Conductive strips 20 are arranged adjacent the conductive leads 14 in the corner, and a strip of anisotropically conductive elastomeric material 22 is forced into the corner by means of an angled anvil 26 urged by a spring 28. Springs 28 support the electrical conductor and the charge plate 12. The elastomeric conductive material 22 makes electrical contact between the respective conductors 20 and 14.

Although the curable epoxy embodiment is preferred for permanent connections, the elastomeric embodiment is useful for connections that need to be opened from time to time. A suitable elastomeric anisotropically conductive material may be purchased as Silver Stax Elastomeric Connectors from the PCK Elastomerics Inc., Hatborough, Pa. An anisotropic conductive thermal setting material suitable for use in the present invention may be purchased as Anisotropic Conductive Film (AECT) from the Elform, Inc., Reno, Nev.

Figure 6:
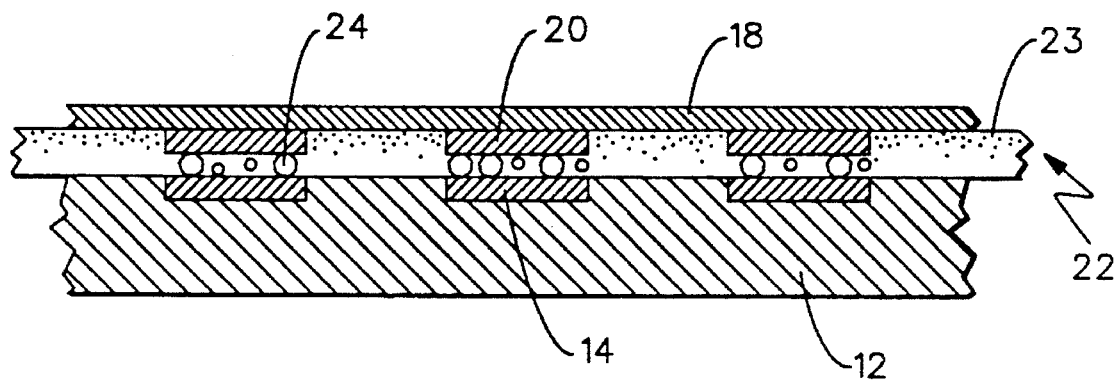
FIG. 6 is a partial cross-sectional view illustrating an alternative embodiment of making a connection to a charge plate according to the present invention.

According to a further embodiment, the uncured adhesive 23 is coated directly on the substrate 18 carrying conductive leads 20 with conductive particles distributed only over the conductive leads 20. FIG. 6 is a cross-sectional view showing an electrical contact made to a charge plate using this alternative construction. A suitable anisotropically conductive material coated on the conductor strip may be purchased as Monosotropic Heat Seal Connector (HSC) from Elform, Inc., Reno, Nev.

Figure 5:
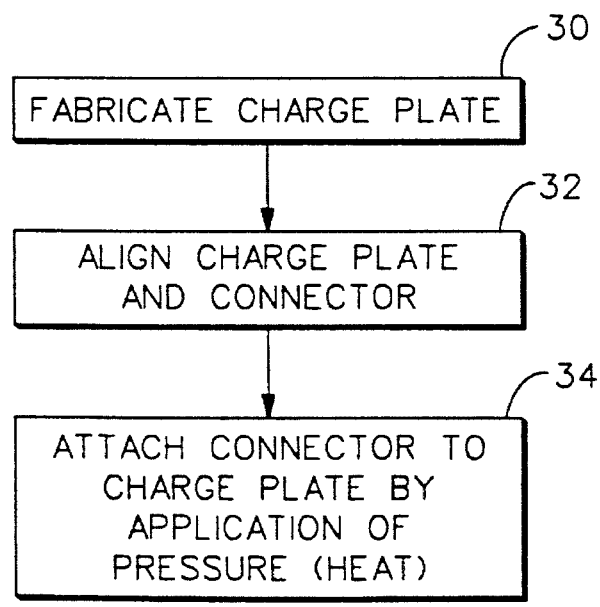
FIG. 5 is a flow chart showing the steps in the process of making an electrical connection to a charge plate according to the present invention.

As shown in FIG. 5, a charge plate was prepared (30) having nickel conductors that were 0.125 millimeters on 0.25 millimeters centers according to the teaching of U.S. Pat. No. 4,560,991. A corresponding conductor strip was prepared having copper strips of conductor on a 50 micron thick support of polyimide material. The conductor and charge plate were aligned (32) in a fixture with a strip of thermosetting anisotropically conductive material (AECT) between the connector and the charge plate. The connector was attached to the charge plate (34) by pressing the connector and the charge plate together using a heated anvil for 60 seconds at an anvil temperature of 550° C. under 40 kilograms per centimeter of pressure. Apparatus suitable for use with the AECT thermosetting material is available from Elform, Inc., Reno, Nev. The electrical and mechanical bonds were tested and found to be entirely suitable for use in an ink jet printer.

Advantages

Electrical connections to a charge plate in an ink printer according to the present invention are advantageous in that reliable, high yield connections at densities approaching 200 connections per inch may be achieved. The method of the present invention avoids the necessity of applying solder or flux to the connections thereby significantly simplifying the assembly of the connectors to the print heads. Connections made according to the present invention require less rework than the prior art method of reflow soldering.

We claim:

1. A method of making electrical contact to a charge plate in an ink jet print head comprising the steps of:

employing an anisotropically conductive material between the charge plate and an electrical conductor, to make the electrical contact, the anisotropically conductive material including an elastomeric material containing conductive elements, wherein said charge plate and said electrical conductor are arranged at angles to each other to form a corner; and forcing said elastomeric material into said corner.

2. The method claimed in claim 1, wherein said anisotropically conductive material is an uncured epoxy resin loaded with conductive particles and said method further comprises the steps of applying heat and pressure to cure said epoxy.

3. The method claimed in claim 1, wherein said anisotropically conductive material is an elastomer containing conductive elements and said method further comprises locating said elastomer adjacent said charge plate and an electrical connector and applying and maintaining pressure to said elastomer to make and maintain electrical contact between said charge plate and said electrical conductor.

4. The method claimed in claim 1, wherein said anisotropically conductive material is coated on a conductor.

5. A method of making electrical contact to a charge plate in an ink jet print head, comprising the steps of:

(a) providing a charge plate having an electrode structure on a first substrate;

(b) providing an electrical connector having a pattern of conductive strips on a second substrate;

(c) placing said charge plate and said electrical connector so that said electrode structure and said conductive strips are in opposing alignment;

(d) providing an anisotropically conductive material between said charge plate electrode structure and said electrical connector to form a sandwich;

(e) applying sufficient pressure to said sandwich to cause said anisotropically conductive material to form electrical contacts between said electrode structure and said conductive strips, said anisotropically conductive material including an elastomeric material containing conductive elements, wherein said charge plate and said electrical conductor are arranged at angles to each other to form a corner; and (f) forcing said elastomeric material into said corner.

6. The method of making electrical contact to a charge plate claimed in claim 5, wherein said anisotropically conductive material is a thermosetting epoxy loaded with electrical conductive particles, and wherein said step of applying pressure to said sandwich further includes applying sufficient heat to cure said epoxy.

7. A charge plate assembly for an ink jet print head, comprising:

(a) a charge plate having a plurality of charge electrodes, and a corresponding plurality of conductive leads;

(b) an electrical conductor including a layer of insulating material upon which are supported a plurality of conductive strips;

(c) anisotropically conductive means disposed between the charge plate and the electrical conductor, for making electrical contact between said conductive leads and said electrically conductive strips, said anisotropically conductive material including an elastomeric material containing conductive elements, wherein said charge plate and said electrical conductor are arranged at angles to each other to form a corner; and (d) means for forcing said elastomeric material into said corner.

8. The charge plate assembly claimed in claim 7, wherein said anisotropically conductive means comprises an uncured epoxy resin loaded with conductive particles.

9. The charge plate assembly claimed in claim 7, wherein said elastomeric material is sandwiched between said charge plate and said electrical conductor, and further comprising means for applying and maintaining pressure on said sandwich.

* * * * *